United States Patent
Cha et al.

(10) Patent No.: US 10,424,595 B2
(45) Date of Patent: Sep. 24, 2019

(54) THREE-DIMENSIONAL SEMICONDUCTOR DEVICE

(71) Applicant: SAMSUNG ELECTRONICS CO., LTD., Suwon-si, Gyeonggi-Do OT (KR)

(72) Inventors: Young-San Cha, Hwaseong-si (KR); Dongkyu Youn, Ansan-si (KR); Tae-Sung Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/470,952

(22) Filed: Mar. 28, 2017

(65) Prior Publication Data

US 2017/0278863 A1 Sep. 28, 2017

(30) Foreign Application Priority Data

Mar. 28, 2016 (KR) .................. 10-2016-0037078

(51) Int. Cl.
*H01L 27/1157* (2017.01)
*H01L 27/11582* (2017.01)
*H01L 27/11573* (2017.01)
*H01L 27/11565* (2017.01)
*H01L 27/11575* (2017.01)

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01)

(58) Field of Classification Search
CPC ......... H01L 27/11582; H01L 27/11573; H01L 27/1157; H01L 27/11575; H01L 27/11565; H01L 27/11578
See application file for complete search history.

(56) References Cited

U.S. PATENT DOCUMENTS 7,240,314 B1 7/2007 Leung
8,278,695 B2 * 10/2012 Kidoh ................. H01L 21/8221
257/314

(Continued)

FOREIGN PATENT DOCUMENTS

KR 10-1212709 12/2012
KR 1020160118113 10/2016

*Primary Examiner* — Laura M Menz
*Assistant Examiner* — Candice Chan
(74) *Attorney, Agent, or Firm* — F. Chau & Associates, LLC

(57) ABSTRACT

A semiconductor device includes a substrate including a cell array region and a peripheral circuit region. The semiconductor device further includes a cell array disposed in the cell array region and including a plurality of cell strings connected to a bit line. The bit line extends in a first direction. The semiconductor device additionally includes a first cell row disposed in the peripheral circuit region and including a plurality of first cells arranged in a second direction crossing the first direction. The first and second directions being parallel to an upper surface of the substrate. The semiconductor device further includes a plurality of first interconnect lines each having a longitudinal axis in the first direction and connected to the plurality of first cells, and a plurality of first power lines extending in the second direction and connected to the plurality of first cells through the first interconnect lines.

9 Claims, 15 Drawing Sheets

(56) References Cited

U.S. PATENT DOCUMENTS

| | | |
|---|---|---|
| 8,885,428 B2 | 11/2014 | Chen et al. |
| 8,933,502 B2 | 1/2015 | Higashitani et al. |
| 9,123,430 B2 | 9/2015 | Cernea |
| 9,287,260 B1 * | 3/2016 | Smith ............... H01L 27/11573 |
| 2013/0248975 A1 | 9/2013 | Hishida et al. |
| 2015/0054046 A1 | 2/2015 | Higashitani et al. |
| 2016/0293624 A1 * | 10/2016 | Sonehara .......... H01L 27/11582 |
| 2016/0293626 A1 | 10/2016 | Kim et al. |

* cited by examiner

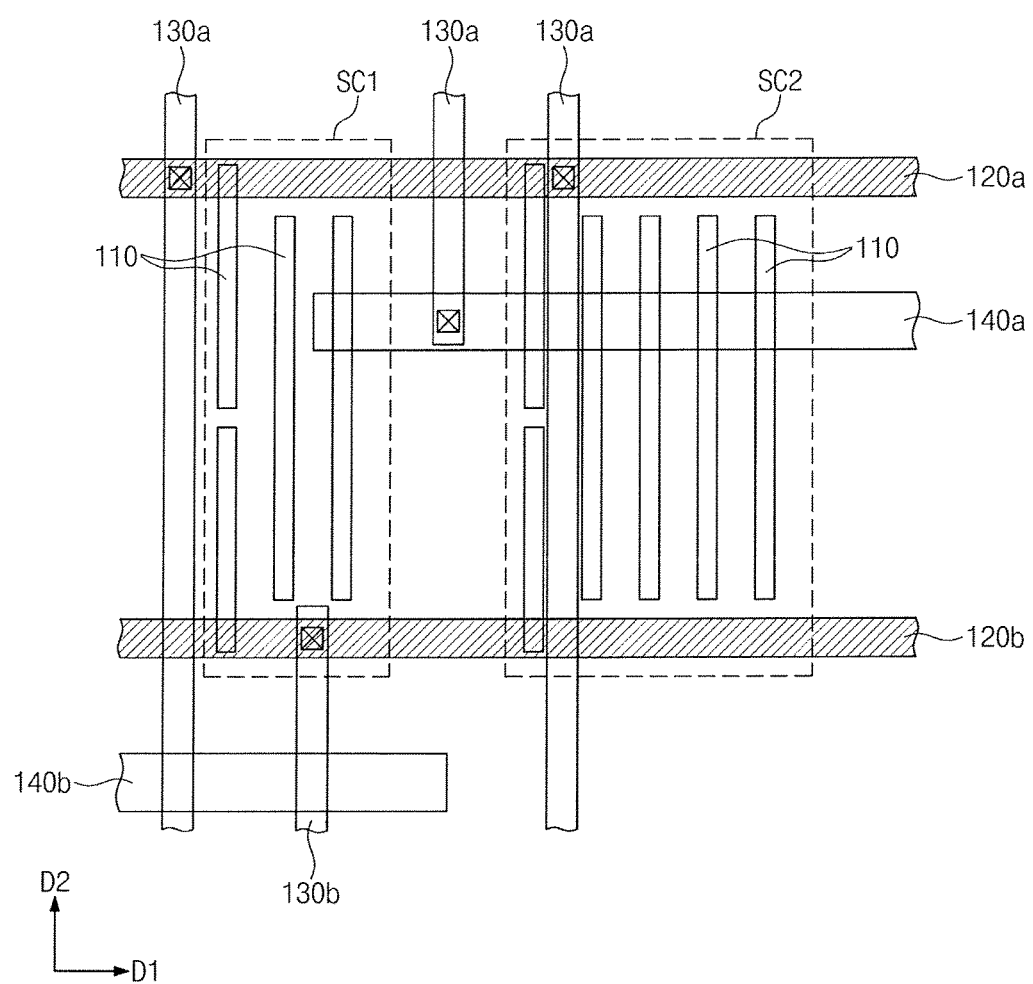

THREE-DIMENSIONAL SEMICONDUCTOR DEVICE

CROSS-REFERENCE TO RELATED APPLICATION

This U.S. non-provisional patent application claims priority under 35 U.S.C. § 119 to Korean Patent Application No. 10-2016-0037078 filed on Mar. 28, 2016 in the Korean Intellectual Property Office, the disclosure of which is incorporated by reference herein in its entirety.

TECHNICAL FIELD

Exemplary embodiments of the present inventive concept relate to a semiconductor device and, more particularly, to a three-dimensional semiconductor device.

DISCUSSION OF THE RELATED ART

Due to the small size, multi-function and/or low fabrication cost of semiconductor devices, the electronic industry has advanced at a fast rate. Types of semiconductor devices include memory devices for storing logic data, semiconductor logic devices for processing operations of logic data, and hybrid semiconductor devices having both the function of the semiconductor memory devices and the function of the semiconductor logic devices.

As the electronic industry has grown, demand for advanced semiconductor devices has increased. For example, there has been an increased demand for semiconductor devices having a high speed, and/or superior reliability. To attend to these demands and further minimize the semiconductor devices, patterns of the semiconductor devices are being reduced. However, reduced pattern widths present new design challenges.

SUMMARY

According to an exemplary embodiment of the present inventive concept, a semiconductor device includes a substrate including a cell array region and a peripheral circuit region. The semiconductor device further includes a cell array disposed in the cell array region and including a plurality of cell strings connected to a bit line. The bit line extends in a first direction. The semiconductor device additionally includes a first cell row disposed in the peripheral circuit region and including a plurality of first cells arranged in a second direction crossing the first direction. The first and second directions being parallel to an upper surface of the substrate. The semiconductor device further includes a plurality of first interconnect lines each having a longitudinal axis in the first direction and connected to the plurality of first cells. The semiconductor device may additionally include a plurality of first power lines extending in the second direction and connected to the plurality of first cells through the first interconnect lines.

According to an exemplary embodiment of the present inventive concept, a semiconductor device includes first and second lower power lines that extend along a first direction at a first height from an upper surface of a substrate and that are alternately arranged along a second direction crossing the first direction. The semiconductor device further includes first and second upper power lines that extend along the second direction at a second height from the upper surface of the substrate. The second height is greater than the first height, and the first and second upper power lines are alternately arranged along the first direction. The first upper power lines are electrically connected to the first lower power lines, and the second upper power lines are electrically connected to the second lower power lines. The semiconductor device further includes dummy interconnect lines electrically connected in parallel to the first and second lower power lines at a third height from the upper surface of the substrate. The third height is less than the first height.

According to an exemplary embodiment of the present inventive concept, a semiconductor device includes a substrate and a first cell row disposed on the substrate. In addition, the first cell row includes a plurality of first cells arranged in a first direction. The semiconductor device further includes a plurality of first interconnect lines disposed at a first height from an upper surface of the substrate. The first interconnect lines extend in a second direction crossing the first direction. The first and second directions extend parallel to an upper surface of the substrate. The first interconnect lines are connected to the plurality of first cells. The semiconductor device further includes a plurality of dummy interconnect lines at the first height and a plurality of first power lines extending in the first direction and connected to the plurality of first cells.

BRIEF DESCRIPTION OF THE DRAWINGS

FIGS. 5A and 5B are plan views partially illustrating a peripheral circuit region of a three-dimensional semiconductor memory device according to an exemplary embodiment of the present inventive concept;

DETAILED DESCRIPTION OF THE EMBODIMENTS

Figure 1:
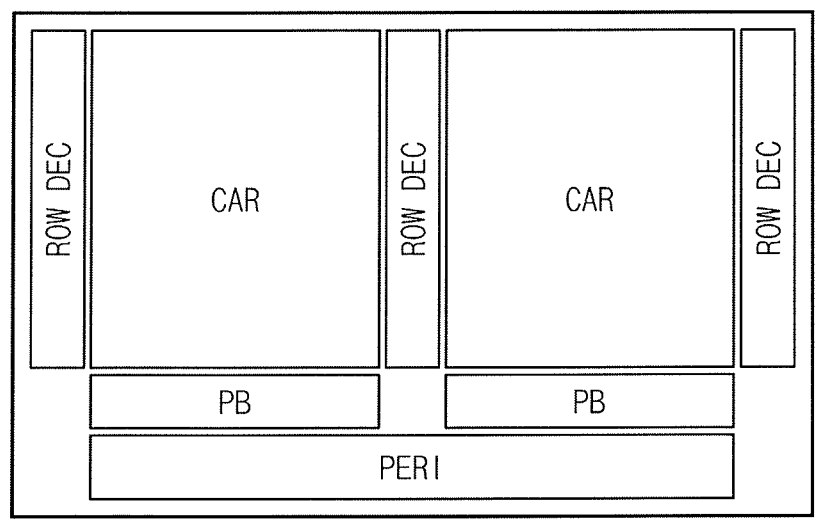
FIG. 1 is a block diagram illustrating a three-dimensional semiconductor memory device according to an exemplary embodiment of the present inventive concept.

FIG. 1 is a block diagram illustrating a three-dimensional semiconductor memory device according to an exemplary embodiment of the present inventive concept.

Referring to FIG. 1, a three-dimensional semiconductor memory device may include cell arrays CAR, row decoders ROW DEC, page buffers PB, and peripheral circuits PERI.

The cell arrays CAR may include a plurality of three-dimensionally arranged memory cells, and bit lines and word lines that are electrically connected to the memory cells. The row decoder ROW DEC may select one of the word lines by decoding address signals output from an external device. For example, a host device. The page buffer PB may be connected to one of the cell arrays CAR through the bit lines, and the page buffer PB may read data stored in the memory cells. The page buffer PB may be connected to one of the bit lines which is selected according to address signals from an external device and decoded by a column decoder.

The peripheral circuits PERI may control read, write, and/or erase operations of the memory cells in response to control signals. The peripheral circuits PERI may include various logic circuits such as an AND gate, an OR gate, a NAND gate, a NOR gate, an inverter, a flip-flop, and a latch.

Figure 2:
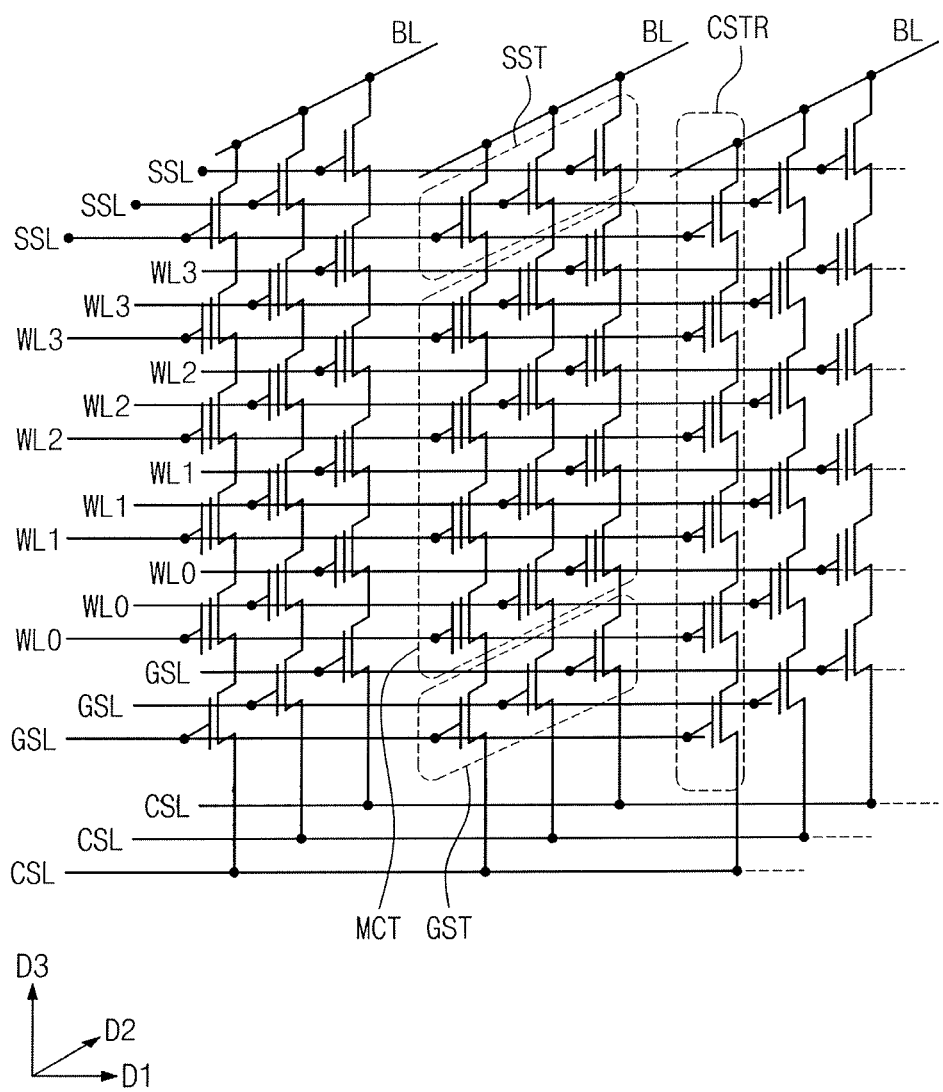
FIG. 2 is a circuit diagram illustrating a cell array of a three-dimensional semiconductor memory device according to an exemplary embodiment of the present inventive concept.

FIG. 2 is a circuit diagram illustrating a cell array of a three-dimensional semiconductor memory device according to an exemplary embodiment of the present inventive concept.

Referring to FIG. 2, one of the cell arrays CAR of the three-dimensional semiconductor memory device may include a common source line CSL, a plurality of bit lines BL, and a plurality of cell strings CSTR arranged between the common source line CSL and the bit lines BL.

Each of the cell strings CSTR may include a ground selection transistor GST connected to the common source line CSL, a string selection transistor SST connected to one of the bit lines BL, and a plurality of memory cell transistors MCT arranged between the ground selection transistor GST and the string selection transistor SST. The ground selection transistor GST, the plurality of memory cell transistors MCT, and the string selection transistor SST may be connected with one another in a series. A ground selection line GSL, a plurality of word lines WL0 to WL3, and a plurality of string selection lines SSL may respectively be electrically connected to a gate electrodes of the ground selection transistor GST, gate electrodes of the memory cell transistors MCT, and a gate electrode of the string selection transistor SST.

The gate electrodes of the ground selection transistors GST may be commonly connected to the ground selection line GSL to have the same electric potential. The gates electrodes of the memory cell transistors MCT, which are spaced apart from the common source line CSL by substantially the same distance, may also be commonly connected to one of the word lines WL0 to WL3 to have the same electric potential. A single cell string CSTR may include a plurality of memory cell transistors MCT spaced apart from the common source line CSL by different distances. A plurality of word lines WL0 to WL3 may be disposed between the common source line CSL and each of the bit lines BL. The plurality of word lines WL0 to WL3 may be connected to the memory cell transistors MCT.

Figure 3:
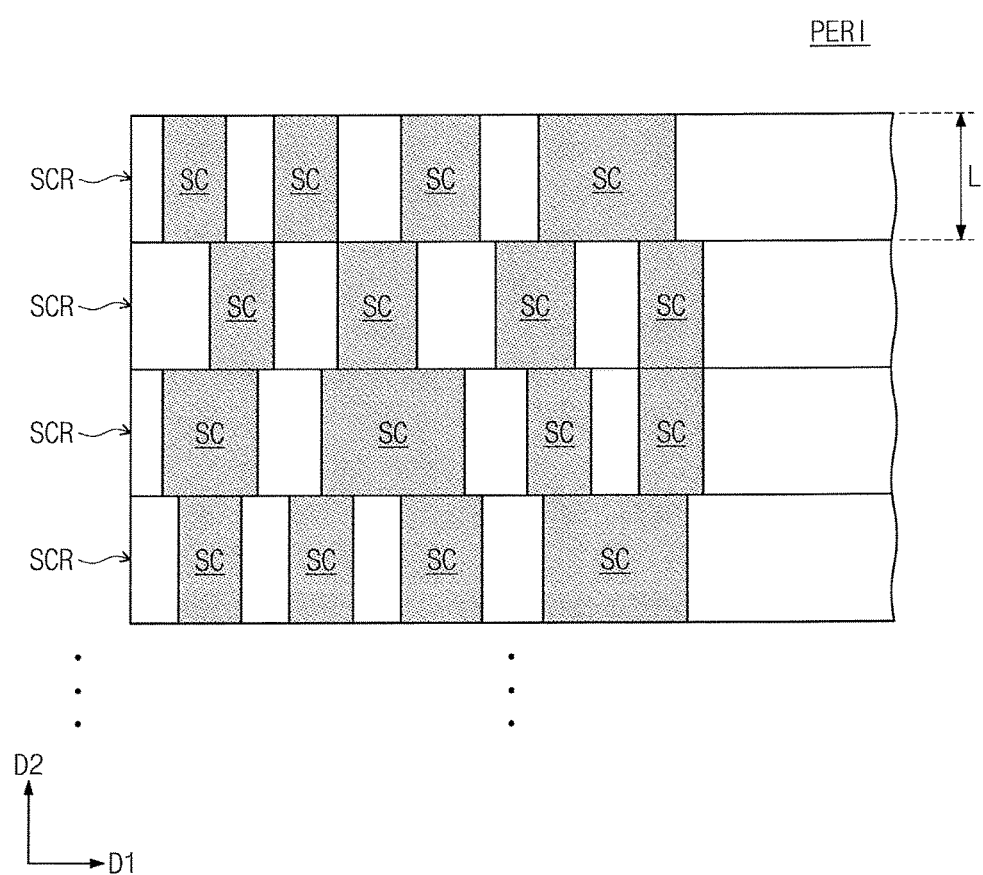
FIG. 3 shows a peripheral circuit of a three-dimensional semiconductor memory device according to an exemplary embodiment of the present inventive concept.

FIG. 3 shows a peripheral circuit of a three-dimensional semiconductor memory device according to an exemplary embodiment of the present inventive concept.

Referring to FIG. 3, the peripheral circuit PERI may include a plurality of standard cell rows SCR, and each of the standard cell rows SCR may include a plurality of standard cells SC. In each of the standard cell rows SCR, the standard cells SC may be designed using a cell library including information for achieving a desired logic circuit. Each of the standard cells SC may include logic circuits such as an AND gate, an OR gate, a NOR gate, an inverter, etc. Various standard cells SC may be integrally combined with one another to constitute a single function circuit. The standard cells SC may have different sizes according to their function.

Each of the standard cells SC may have the same unit length and different widths based on their function. In an exemplary embodiment of the present inventive concept, the standard cells SC disposed in each of the standard cell rows SCR may be arranged in a first direction D1 and have different widths extending in the first direction D1. The standard cells SC may have the same unit length L extending in a second direction D2. In addition, the standard cell rows SCR may be arranged along the second direction D2. The unit length L of the standard cell SC may be determined by sizes of an N-type metal-oxide-semiconductor (NMOS) or a P-type-metal-oxide-semiconductor (PMOS) and minimum widths of interconnected lines included in the standard cell SC.

Figure 4:
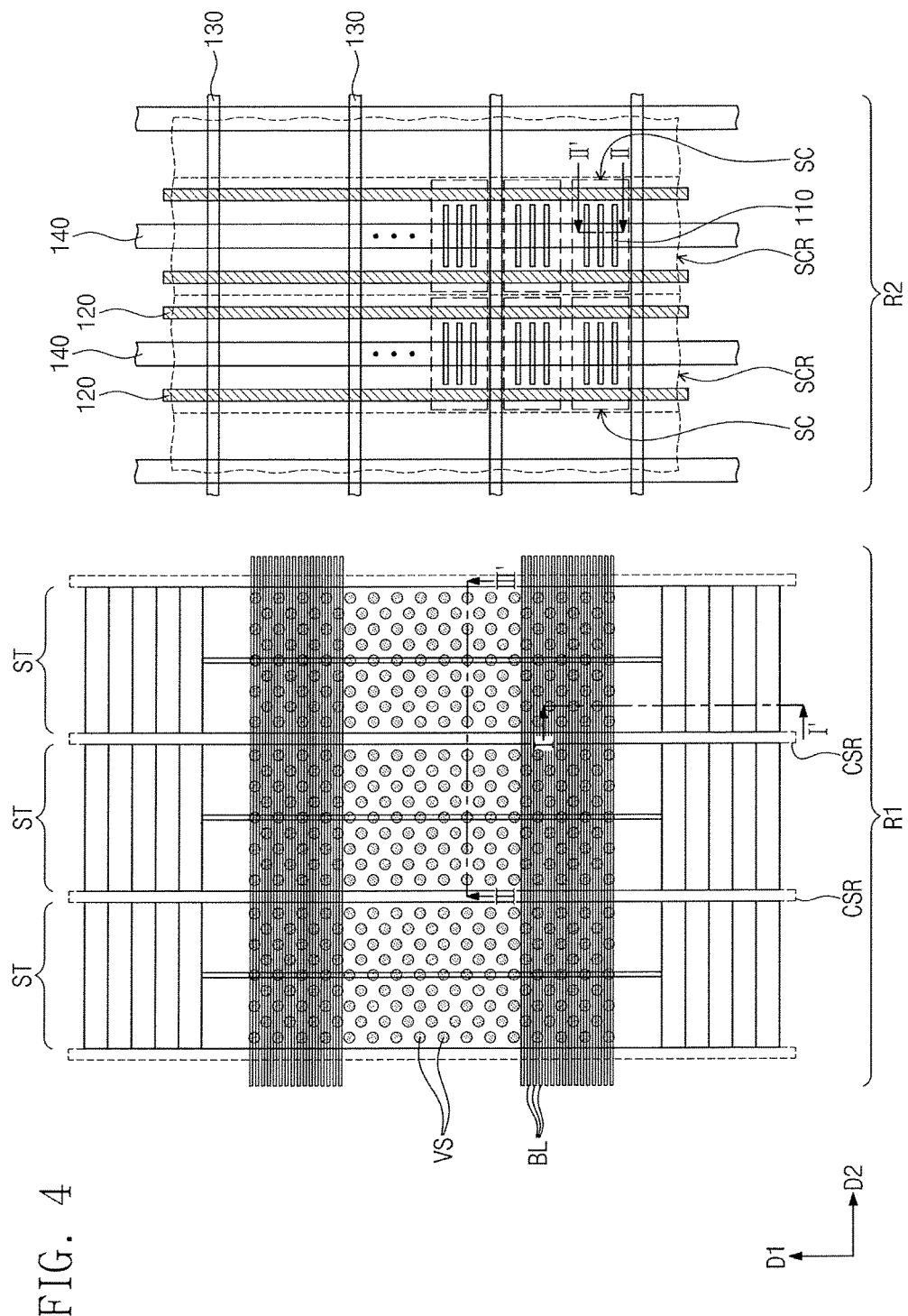
FIG. 4 is a plan view illustrating a three-dimensional semiconductor memory device according to an exemplary embodiment of the present inventive concept.
Figure 5A:
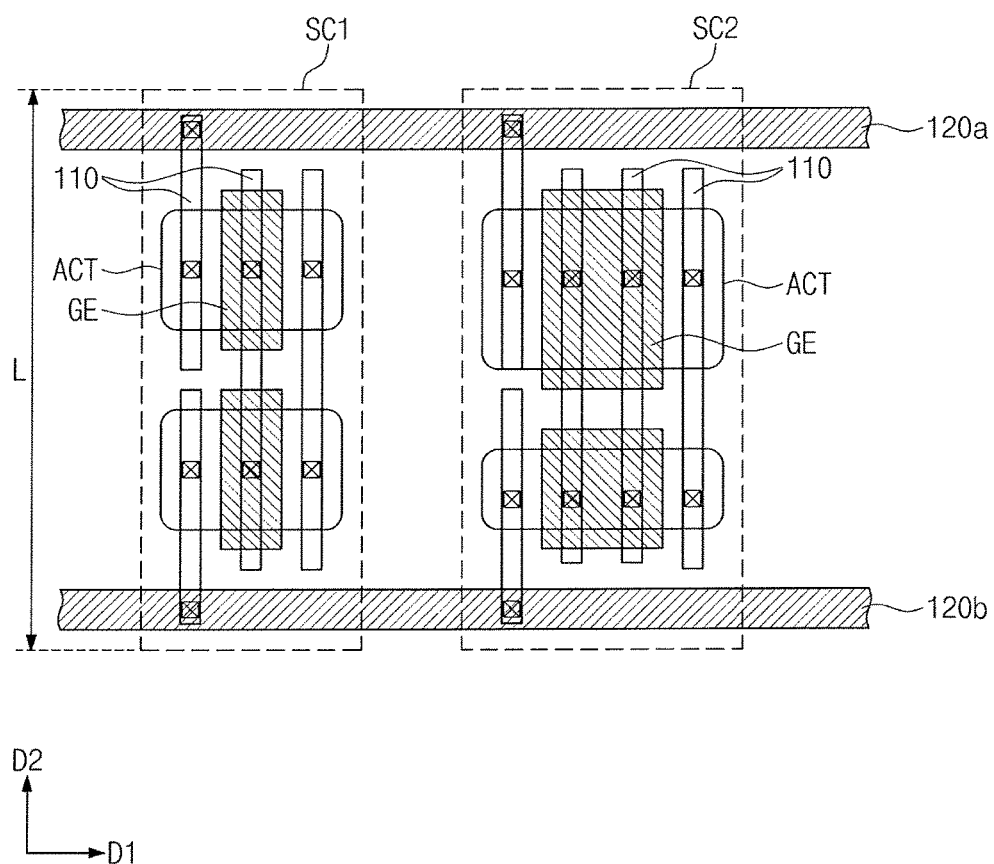

FIG. 4 is a plan view illustrating a three-dimensional semiconductor memory device according to an exemplary embodiment of the present inventive concept. FIGS. 5A and 5B are plan views partially illustrating a peripheral circuit region of a three-dimensional semiconductor memory device according to an exemplary embodiment of the present inventive concept.

Figure 6:
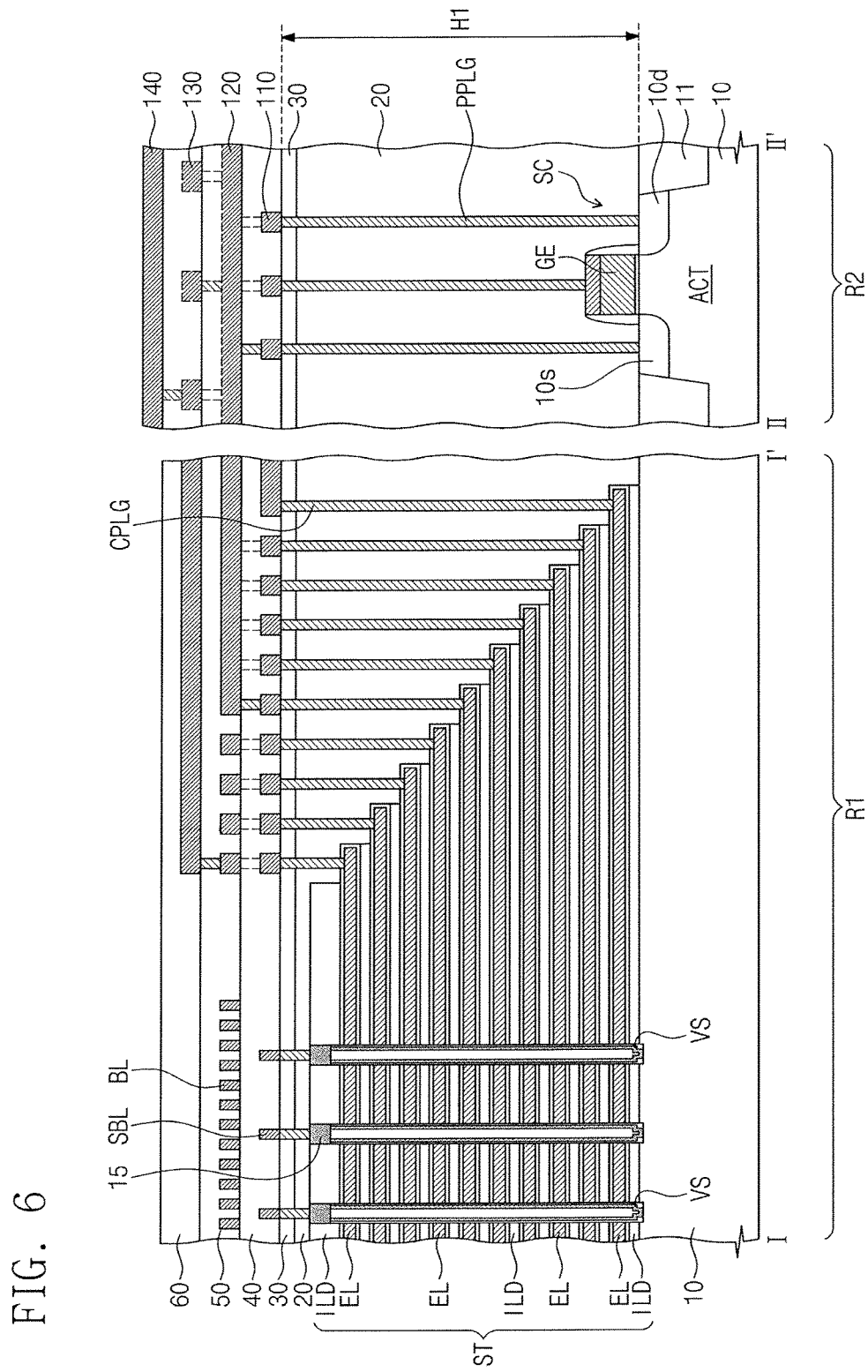
FIG. 6 is a cross-sectional view taken along lines I-I' and II-II' of FIG. 4 to illustrate a three-dimensional semiconductor memory device according to an exemplary embodiment of the present inventive concept.
Figure 7:
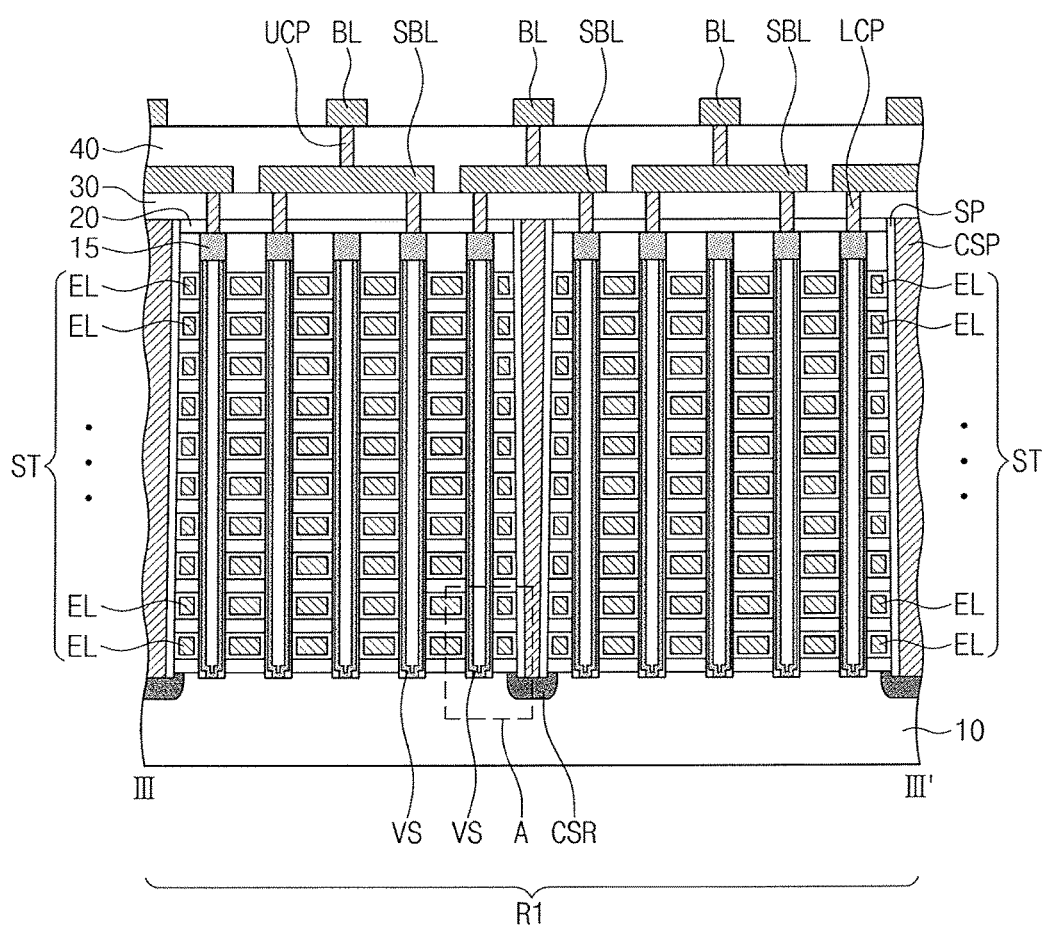
FIG. 7 is a cross-sectional view taken along line of FIG. 4 to illustrate a three-dimensional semiconductor memory device according to an exemplary embodiment of the present inventive concept.
Figure 8A:
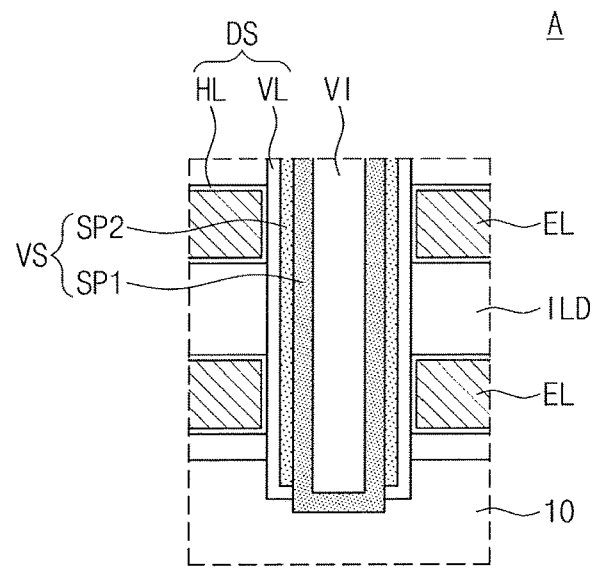
FIGS. 8A and 8B are enlarged views portion 'A' of FIG. 7 according to an exemplary embodiment of the present inventive concept.
Figure 8B:
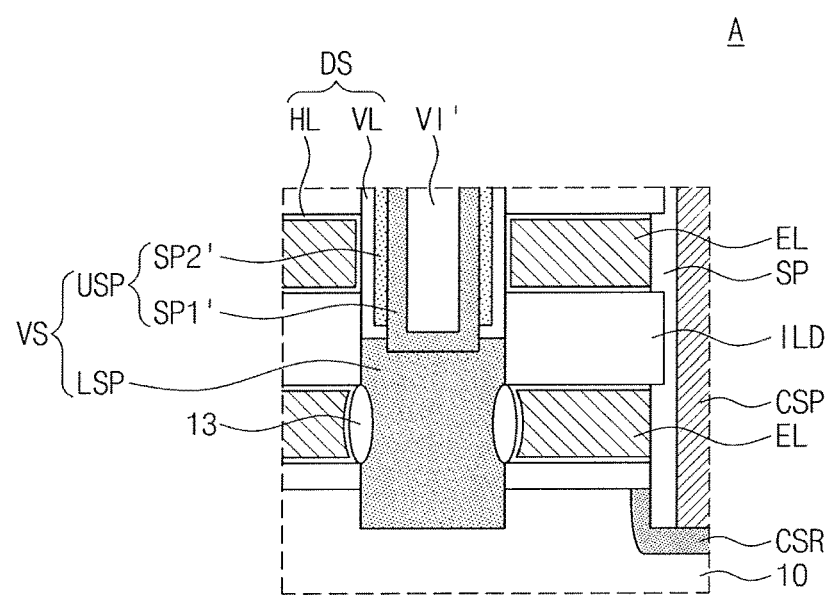

FIG. 6 is a cross-sectional view taken along lines I-I' and II-II' of FIG. 4 to illustrate a three-dimensional semiconductor memory device according to an exemplary embodiment of the present inventive concept. FIG. 7 is a cross-sectional view taken along line III-III' of FIG. 4 to illustrate a three-dimensional semiconductor memory device according to an exemplary embodiment of the present inventive concept. FIGS. 8A and 8B are enlarged views of portion 'A' of FIG. 7 according to an exemplary embodiment of the present inventive concept.

Referring to FIGS. 4, 6 and 7, a three-dimensional semiconductor memory device may include a substrate 10 which may be divided into a cell array region R1 and a peripheral circuit region R2, and may be made of a semiconductor material. For example, the substrate 10 may silicon (Si), germanium (Ge), silicon-germanium (SiGe), gallium-arsenic (GaAs), indium-gallium-arsenic (InGaAs), aluminum-gallium-arsenic (AlGaAs), and/or a mixture thereof. The substrate 10 may be a bulk silicon substrate, a silicon-on-insulator (SOI) substrate, a germanium substrate, a germanium-on-insulator (GOI) substrate, a silicon-germanium substrate, or an epitaxial thin film substrate obtained by performing a selective epitaxial growth.

In an exemplary embodiment of the present inventive concept, the cell array CAR discussed with reference to FIG. 2 may be disposed on the substrate 10 in the cell array region R1. The standard cell rows SCR discussed with reference to FIG. 3 may be disposed on the substrate 10 in the peripheral circuit region R2.

In addition, the cell array CAR disposed in the cell array region R1 may include stack structures ST that extend in the first direction D1 and are spaced apart from one another in the second direction D2. The cell array CAR may further include vertical structures VS that penetrate the stack structures ST in a direction substantially perpendicular to the substrate 10, a data storage layer DS (e.g., in FIG. 8A) disposed between the stack structures ST and the vertical structures VS, and bit lines BL that extend in the second direction D2 on the stack structures ST. For example, the bit lines BL may overlap the stack structures ST.

In addition, each of the stack structures ST may include electrodes EL and insulation layers ILD that are alternately and vertically stacked on the substrate 10. For example, the electrodes EL and insulation layers ILD are repeatedly disposed on one another. For example, the electrodes EL may include at least one of a doped semiconductor (e.g., doped silicon, etc.), a metal (e.g., tungsten, copper, aluminum, etc.), a conductive metal nitride (e.g., titanium nitride, tantalum nitride, etc.), and a transitional metal (e.g., titanium, tantalum, etc.). The insulation layers ILD may include an insulative material such as a silicon oxide layer, a silicon nitride layer, a silicon oxynitride layer, or a low-k dielectric layer. In the stack structures ST, the electrodes EL may be used as the ground selection line GSL, the word lines WL, and the string selection line SSL discussed with reference to FIG. 2.

The stack structures ST may have a stepwise structure extending to an edge of the cell array region R1 to electrically connect each of the electrodes EL to the row decoder ROW DEC (e.g., in FIG. 1). For example, the stepwise structure of the stack structures ST may extend downward along the first direction D1. For example, each step of the stepwise structure decreases in length beginning from a lowermost step on the substrate 10. An interconnect structure may be disposed on portions of the stack structures ST, so that the electrodes EL may be connected to the row decoder ROW DEC (e.g., in FIG. 1) through the interconnect structure. The interconnect structure may include contact plugs CPLG and interconnect lines.

The vertical structures VS may be disposed on the substrate 10 in the cell array region R1 and may penetrate the stack structures ST. For example, the vertical structures VS may be formed through a hole extending from a top insulation layer and penetrating the stack structures ST to the substrate 10. The vertical structures VS may include a semiconductor material or a conductive material. When viewed from a plan view, the vertical structures VS may be arranged in a zigzag manner or matrix shape. A conductive pad 15 may be disposed on a top end of each of the vertical structures VS. The conductive pad 15 may function as a drain region electrically connected to one of a plurality of the bit lines BL.

For example, as shown in FIG. 8A, each of the vertical structures VS may include a first semiconductor pattern SP1 in contact with the substrate 10, and a second semiconductor pattern SP2 interposed between the first semiconductor pattern SP1 and the electrodes EL. In addition, the second semiconductor pattern SP2 extends toward the substrate 10.

Further, the first semiconductor pattern SP1 may be in contact with the second semiconductor pattern SP2 and the substrate 10. The first semiconductor pattern SP1 may electrically connect the second semiconductor pattern SP2 to the substrate 10. The first semiconductor pattern SP1 may have a bottom surface extending beyond an upper surface of the substrate 10. The first semiconductor pattern SP1 may have a shape similar to a hollow pipe or a tube. A lower end of the first semiconductor pattern SP1 may be in a closed state, and a central interior portion of the first semiconductor pattern SP1 may be filled with a filling insulation pattern VI. For example, the first semiconductor pattern SP1 may have a bottom surface that is continuous between both of its sides. In addition, the first semiconductor pattern SP1 may have a shape similar to a pillar.

The second semiconductor pattern SP2 may have a shape similar to a tube or a pipe that has opened top and bottom ends. The second semiconductor pattern SP2 may have a bottom surface higher than the bottom surface of the first semiconductor pattern SP1 and spaced apart from the substrate 10. In addition, the second semiconductor pattern SP2 may be in direct contact with the substrate 10.

For example, the second semiconductor pattern SP2 may extend into the substrate 10. However, as shown in FIG. 8A, the semiconductor pattern SP2 is not in direct contact with the substrate 10.

The first and second semiconductor patterns SP1 and SP2 may be in an undoped state or doped with impurities having the same conductivity as the substrate 10. The first and second semiconductor patterns SP1 and SP2 may be in a polycrystalline or single crystalline state. In addition, as shown in FIG. 8B, each of the vertical structures VS may include a lower semiconductor pattern LSP and an upper semiconductor pattern USP. The lower semiconductor pattern LSP may be in direct contact with the substrate 10 and penetrate a lowermost electrode EL of the stack structure ST. The upper semiconductor pattern USP may include a first semiconductor pattern SP1' and a second semiconductor pattern SP2'. The first semiconductor pattern SP1' may be coupled to the lower semiconductor pattern LSP and have a shape similar to a tube or a pipe with a closed bottom end. For example, the end facing the substrate may be closed. A central interior of the first semiconductor pattern SP1' may be filled with a filling insulation pattern VI'. The first semiconductor pattern SP1' may be in contact with an inner wall of the second semiconductor pattern SP2' and an upper surface of the lower semiconductor pattern LSP. The first semiconductor pattern SP1' may electrically connect the second semiconductor pattern SP2' to the lower semiconductor pattern LSP. The second semiconductor pattern SP2' may have a shape similar to a tube or a pipe that has opened top and bottom ends. The second semiconductor pattern SP2' might not contact the lower semiconductor pattern LSP, and the second semiconductor pattern SP2' may be spaced apart from the lower semiconductor pattern LSP.

For example, the lower and upper semiconductor patterns LSP and USP may include silicon (Si), germanium (Ge), or a mixture thereof, and may each have different crystalline structures from one another. The lower and upper semiconductor patterns LSP and USP may include at least one of a single crystalline structure, an amorphous structure, and a poly crystalline structure. The lower and upper semiconductor patterns LSP and USP may be in an undoped state or may be doped with impurities having the same conductivity as the substrate 10.

In an exemplary embodiment of the present inventive concept, the data storage layer DS may be disposed between the stack structures ST and the vertical structures VS. The data storage layer DS may include, as shown in FIGS. 8A and 8B, a vertical insulation layer VL that vertically extends along a side surface of the electrode EL and insulation layer ILD. The data storage layer DS may further include a horizontal insulation layer HL that extends along top and bottom surfaces of the electrode EL.

In an exemplary embodiment of the present inventive concept, a common source region CSR may be provided in the substrate 10 between the stack structures ST. For example, the common source region CSR may be disposed on the upper surface of the substrate 10. The common source region CSR may extend parallel to the stack structures ST along the first direction D1. The common source region CSR may be formed by doping second conductive type impurities into the substrate 10. The common source region CSR may include, for example, n-type impurities (e.g., arsenic (As) or phosphor (P)). The common source region CSR may function as the common source line CSL discussed with reference to FIG. 2.

A common source plug CSP may be coupled to the common source region CSR, and a sidewall insulation spacer SP may be interposed between the common source plug CSP and the stack structures ST. For example, the common source plug CSP may have a linear shape and extend along the first direction D1 and along the common source plug CSP.

A filling insulation layer 20 may be disposed over the stack structures so that the stack structures ST and the vertical structures VS are covered. A capping insulation layer 30 may be disposed on the filling insulation layer 20 and may cover the common source plug CSP.

In an exemplary embodiment of the present inventive concept, subsidiary interconnections SBL may be disposed on the capping insulation layer 30 so as to electrically connect adjacent vertical structures VS to one another. The subsidiary interconnections SBL may have a longitudinal axis in the second direction D2, and may have different lengths from one another. For example, the subsidiary interconnections SBL may extend in a second direction D2.

A first interlayer dielectric layer 40 may be disposed on the capping insulation layer 30 so as to cover the subsidiary interconnections SBL, and bit lines BL may be disposed on the first interlayer dielectric layer 40. The bit lines BL may extend in the second direction D2 and may be electrically connected to the subsidiary interconnections SBL through upper contact plugs UCP that penetrate the first interlayer dielectric layer 40. For example, the upper contact plugs UCP may be formed through a hole that penetrates the first interlayer dielectric layer 40. The subsidiary interconnections SBL may be electrically connected to the vertical structures VS through lower contact plugs LCP provided between the subsidiary interconnections SBL and the vertical structures VS. For example, the lower contact plugs LCP may be formed through a hole that penetrates the capping insulating layer 30 and the filling insulation layer 20.

Figure 9:
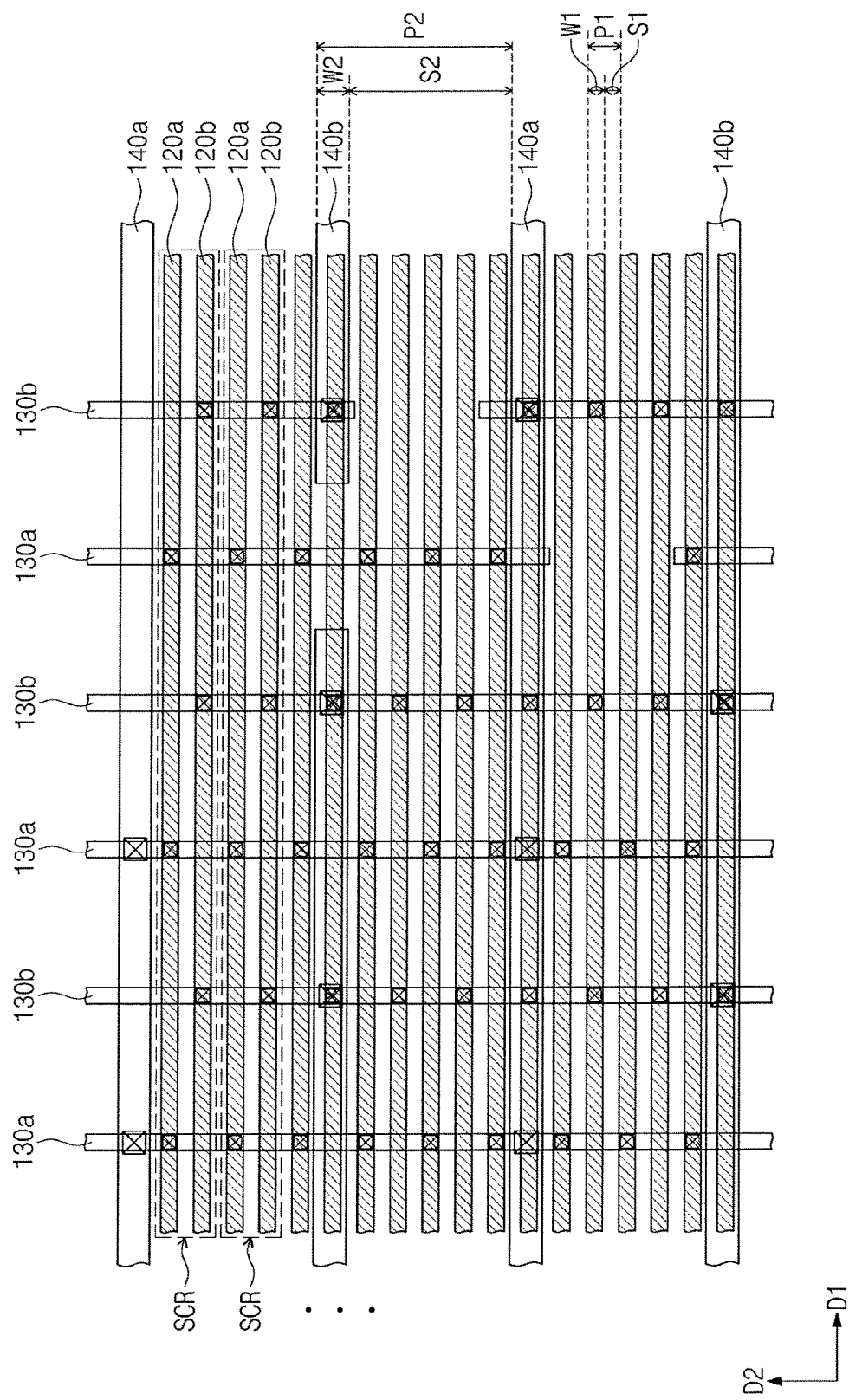
FIG. 9 is a plan view partially illustrating a peripheral circuit region of a three-dimensional semiconductor memory device according to an exemplary embodiment of the present inventive concept.

In an exemplary embodiment of the present inventive concept, the standard cell rows SCR may be arranged along the second direction D1 on the substrate 10 of the peripheral circuit region R2 (e.g., as shown in FIG. 9). Each of the standard cell rows SCR may include a plurality of the standard cells SC arranged along the first direction D1 (e.g., as shown in FIG. 4).

Further, referring to FIGS. 5A, 5B and 6, first and second standard cells SC1 and SC2 may be provided on the substrate 10 in the peripheral circuit region R2. The first and second standard cells SC1 and SC2 may have a rectangular shape in accordance with a predetermined design rule, as shown in FIGS. 5A and 5B. The first and second standard cells SC1 and SC2 may each have different widths in the first direction D1, and may each have the same unit length L in the second direction D2. Each of the first and second standard cells SC1 and SC2 may include metal-oxide-semiconductor (MOS) transistors having various sizes.

Each of the first and second standard cells SC1 and SC2 may include NMOS and PMOS regions, and active regions ACT may be bordered by the device isolation layer 11 on the NMOS and PMOS regions. In addition, each of the first and second standard cells SC1 and SC2 may include a gate electrode GE and impurity regions 10s and 10d at opposing sides of the gate electrode GE. In addition, the active regions ACT may be provided between the impurity regions 10s and 10d. For example, the impurity regions 10s and 10d may either be a source region or a drain region of the first and second standard cells SC1 and SC2.

In an exemplary embodiment of the present inventive concept, the standard cells SC, SC1 and SC2 in the peripheral circuit region R2 may be covered by the filling insulation layer 20 and the capping insulation layer 30.

In an exemplary embodiment of the present inventive concept, first interconnect lines 110 may be provided to connect to the standard cells SC, SC1 and SC2 in the peripheral circuit region R2. Referring to FIGS. 5A and 6, the first interconnect lines 110 may be coupled to the active region ACT, the gate electrode GE, and the impurity regions 10s and 10d.

The first interconnect lines 110 may be disposed at a first height H1 extending from the substrate 10, and may have a longitudinal axis parallel to the bit lines BL in the second direction D2. For example, the first interconnect lines 110 may be positioned at the first height H1 substantially the same as that of the subsidiary interconnections SBL disposed in the cell array region R1. The first interconnect lines 110 and the subsidiary interconnections SBL may be formed simultaneously. The first interconnect lines 110 may be electrically connected to the standard cells SC, SC1 and SC2 through contact plugs PPLG that penetrate the filling insulation layer 20 and the capping insulation layer 30. For example, the contact plugs PPLG may be provided by forming a hole that penetrates the filling insulation layer 20 and the capping insulation layer 30. The first interconnect lines 110 may have a length less than the unit length L of each of the standard cells SC, SC1 and SC2 extending in the second direction D2. The first interconnect lines 110 may include at least one of, for example, a doped semiconductor, a metal (e.g., tungsten, titanium, tantalum, etc.), a conductive metal silicide (e.g., titanium nitride, tantalum nitride, etc.), and a metal-semiconductor compound (e.g., titanium silicide, tungsten silicide, nickel silicide, etc.).

A plurality of lower power lines 120, 120a and 120b may be disposed on the first interconnect lines 110 in the peripheral circuit region R2. In an exemplary embodiment of the present inventive concept, the lower power lines 120, 120a and 120b may extend along the first direction D1 to intersect the first interconnect lines 110. For example, the lower power lines 120, 120a and 120b may be disposed on the first interlayer dielectric layer 40. Further, the lower power lines 120, 120a and 120b may be positioned at substantially the same height as the bit lines BL disposed in the cell array region R1.

The lower power lines 120, 120a and 120b may include first lower power lines 120a that provide the standard cells SC, SC1 and SC2 with a first power (e.g., a power voltage) and second lower power lines 120b that provide the standard cells SC, SC1 and SC2 with a second power (e.g., a ground voltage).

A pair of the first and second lower power lines 120a and 120b may extend across each of the standard cell rows SCR. Each of the first and second lower power lines 120a and 120b may be selectively connected to the first interconnect lines 110 through contact plugs penetrating the first interlayer dielectric layer 40. The standard cells SC1 and SC2 in each of the standard cell rows SCR may share a pair of the first and second lower power lines 120a and 120b.

In an exemplary embodiment of the present inventive concept, a second interlayer dielectric layer 50 may be disposed on the first interlayer dielectric layer 40 to cover the lower power lines 120, 120a and 120b. A plurality of second interconnect lines 130 may be disposed on the second interlayer dielectric layer 50 in the peripheral circuit region R2. The plurality of second interconnect lines 130 may extend along the second direction D2 to intersect the lower power lines 120, 120a and 120b.

In an exemplary embodiment of the present inventive concept, the second interconnect lines 130 may include power voltage lines 130a that are electrically connected to the first lower power lines 120a, and ground voltage lines 130b that are electrically connected to the second lower power lines 120b.

A third interlayer dielectric layer 60 may be disposed on the second interlayer dielectric layer 50 to cover the second interconnect lines 130. A plurality of upper power lines 140, 140a and 140b may be disposed on the third interlayer dielectric layer 60 in the peripheral circuit region R2. In an exemplary embodiment of the present inventive concept, the upper power lines 140, 140a and 140b may extend along the first direction D1 to intersect the first and second interconnect lines 110 and 130. The lower power lines 120, 120a and 120b may be arranged so that they are each spaced apart from one another in the second direction D2 at a first interval. In addition, the upper power lines 140, 140a and 140b may be arranged so that they are each spaced apart from one another in the second direction D2 at a second interval greater than the first interval. Each of the upper power lines 140, 140a and 140b may have a line width greater than a line width of each of the lower power lines 120, 120a and 120b.

The upper power lines 140, 140a and 140b may include first upper power lines 140a and second upper power lines 140b. The first and second upper power lines 140a and 140b may be alternately disposed in the second direction D2. For example, the first upper power lines 140a may be connected to the first lower power lines 120a through contact plugs and the power voltage lines 130a, and the second upper power lines 140b may be connected to the second lower power lines 120b through contact plugs and the ground voltage lines 130b. For example, the upper power lines 140 may be connected to the second interconnect lines 130 through a contact plug, and the second interconnect lines 130 may be connected to the lower power lines 120 through a contact plug. The first and second upper power lines 140a and 140b may be electrically connected to the standard cells SC1 and SC2 through the first interconnect lines 110, the power voltage lines 130a, and the ground voltage lines 130b.

In an exemplary embodiment of the present inventive concept, the lower and upper power lines 120a, 120b, 140a and 140b may extend along the first direction D1 in the peripheral circuit region R2, and may be separately disposed at different heights from one another. It may be possible to increase the process margin in the peripheral circuit region R2 when the three-dimensional semiconductor memory device is fabricated.

FIG. 9 is a plan view partially illustrating a peripheral circuit region of a three-dimensional semiconductor memory device according to an exemplary embodiment of the present inventive concept.

Referring to FIG. 9, the standard cell rows SCR may be disposed along the second direction D2 on the substrate 10 in the peripheral circuit region R2. The standard cells SC of FIG. 3 may be arranged along the first direction D1 in each standard cell row SCR. As discussed with reference to FIGS. 5A, 5B and 6, each of the standard cells may include logic devices and the first interconnect lines 110 connected to the logic devices.

In an exemplary embodiment of the present inventive concept, a pair of the lower power lines 120a and 120b may be provided in each of standard cell rows SCR. For example, the first and second lower power lines 120a and 120b may extend along the first direction D1 and may be alternately disposed in the second direction D2. The first and second lower power lines 120a and 120b may intersect the first interconnect lines 110 of FIG. 5A. The first lower power lines 120a may provide the standard cells SC with a power voltage. The second lower power lines 120b may provide the standard cells SC with a ground voltage.

The second interconnect lines 130a and 130b (e.g., the power voltage line and the ground voltage line) may extend in the second direction D2 on the lower power lines 120a and 120b. In an exemplary embodiment of the present inventive concept, the second interconnect lines 130a and 130b may include the power voltage lines 130a and the ground voltage lines 130b as formerly discussed. The power voltage lines 130a and the ground voltage lines 130b may be alternately arranged along the first direction D1. Each of the power voltage lines 130a may be connected to the first lower power lines 120a through contact plugs penetrating the second interlayer dielectric layer 50 (e.g., in FIG. 6), and each of the ground voltage lines 130b may be connected to the second lower power lines 120b through contact plugs penetrating the second interlayer dielectric layer 50 (e.g., in FIG. 6).

The upper power lines 140a and 140b may be disposed to extend in the first direction D1 on the second interconnect lines 130a and 130b. The upper power lines 140a and 140b may intersect the second interconnect lines 130a and 130b. The upper power lines 140a and 140b may include the first upper power lines 140a to which a power voltage is applied and the second upper power lines 140b to which a ground voltage is applied. The first upper power lines 140a may be connected to the first lower power lines 120a through the power voltage lines 130a, and the second upper power lines 140b may be connected to the second lower power lines 120b through the ground voltage lines 130b. The first and second upper power lines 140a and 140b may be alternately arranged in the second direction D2. For example, the first and second upper power lines 140a and 140b may be parallel to one another. The first and second upper power lines 140a and 140b may have different lengths from one another in the first direction D1. For example, the first and second upper power lines 140a and 140b may be spaced apart from one another by a particular distance in the first direction D1.

The upper power lines 140a and 140b may be arranged along the second direction D2 at a second pitch P2 that is greater than a first pitch P1 of the lower power lines 120a and 120b. For example, the upper power lines 140a and 140b may have a second line width W2 that is greater than a first line width W1 of the lower power lines 120a and 120b, and/or may have a second interval S2 between the upper power lines 140a and 140b that is greater than a first interval S1 between the lower power lines 120a and 120b.

Figure 10:
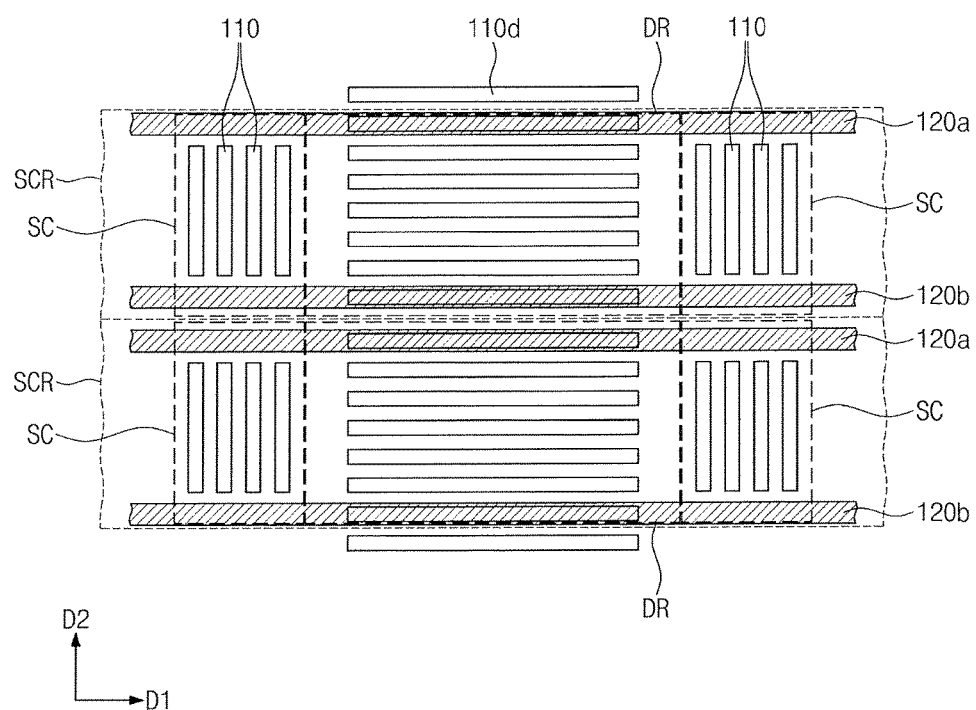
FIGS. 10 and 11 are enlarged plan views illustrating a portion of the peripheral circuit region depicted in FIG. 9 according to an exemplary embodiment of the present inventive concept.
Figure 11:
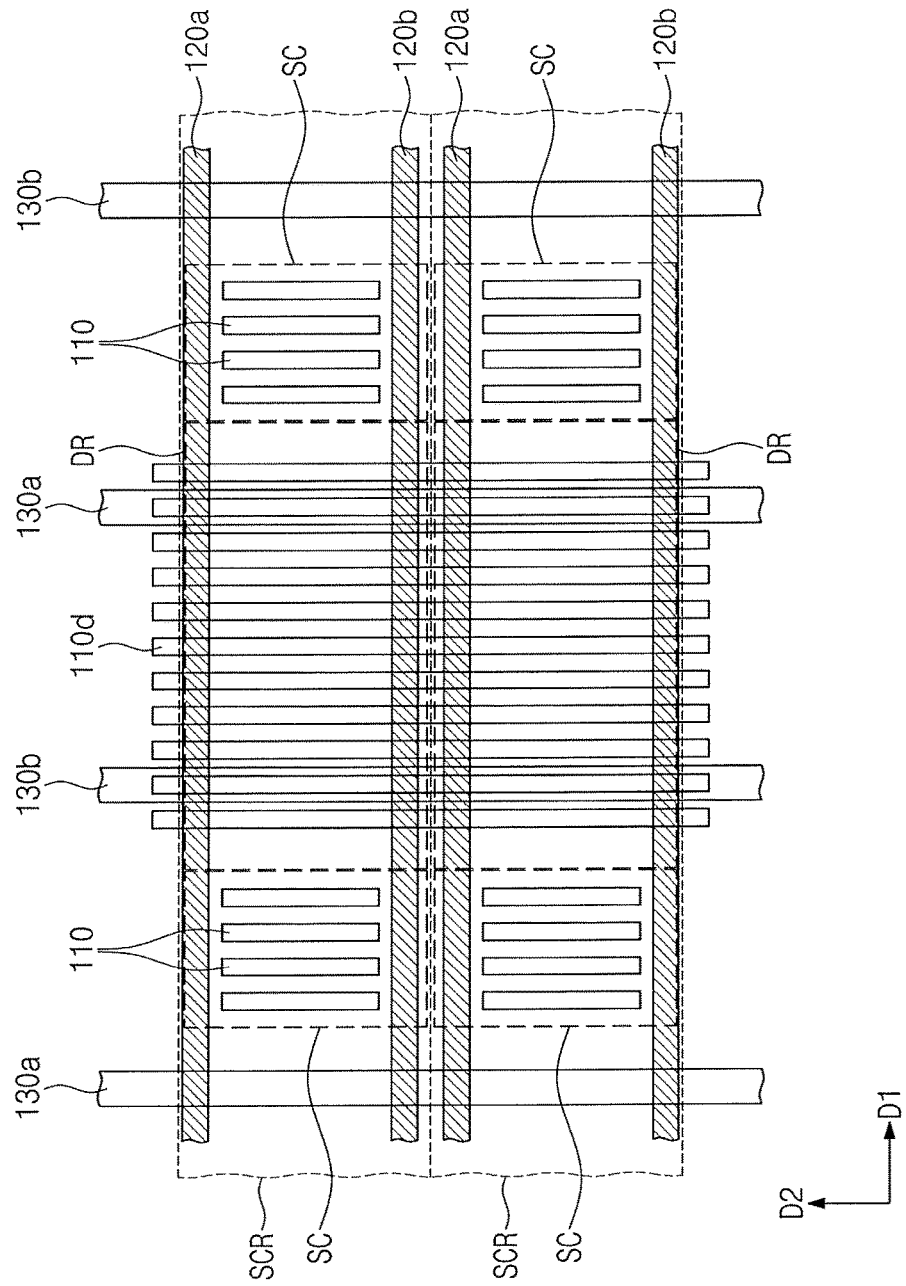

FIGS. 10 and 11 are enlarged plan views illustrating a portion of the peripheral circuit region depicted in FIG. 9 according to an exemplary embodiment of the present inventive concept.

Referring to FIG. 10, the standard cell rows SCR may be disposed on the substrate 10 in the peripheral circuit region R2 of FIG. 4, the standard cells SC may be disposed in each of the standard cell rows SCR. Each of the standard cell rows SCR may include the standard cells SC and a dummy region DR provided between the standard cells SC. The standard cells SC may have the same width in the first direction D1 or different widths from one another in the first direction D1. The standard cells SC may have substantially the same unit length L in the second direction D2 as explained in FIG. 3.

As discussed with reference to FIGS. 5A and 5B, the first interconnect lines 110 may be disposed on and connected to the standard cells SC. As discussed with reference to FIG. 6, the first interconnect lines 110 may be disposed at the first height H1 from the substrate 10.

The first and second lower power lines 120a and 120b disposed at a second height from the substrate 10 may intersect the first interconnect lines 110 at the second height which is greater than the first height (e.g., H1 of FIG. 6). The power and ground voltage lines 130a and 130b disposed at a third height from the substrate 10 may intersect the first interconnect lines 110 at the third height which is greater than the second height. As discussed with reference to FIG. 9, the power voltage lines 130a may be electrically connected to the first lower power lines 120a, and the ground voltage lines 130b may be electrically connected to the second lower power lines 120b.

In an exemplary embodiment of the present inventive concept, dummy interconnect lines 110d may be disposed at the first height (e.g., H1 of FIG. 6) in the dummy region DR. For example, the dummy interconnect lines 110d may be disposed at the same height as the first interconnect lines 11, and may extend parallel to the first and second lower power lines 120a and 120b along the first direction D1, as shown in FIG. 10.

For example, the first interconnect lines 110 may have a longitudinal axis in the second direction D2, and may be disposed at a particular distance from one another in the first direction D1. The dummy interconnect lines 110d may have a longitudinal axis in the first direction D1 and may be disposed at a particular distance from one another in the second direction D2, as shown in FIG. 10.

In addition, as shown in FIG. 11, the dummy interconnect lines 110d may intersect the first and second lower power lines 120a and 120b overlaying the dummy interconnect lines 110d. The dummy interconnect lines 110d may have a longitudinal axis in the second direction D2, and may be disposed at a particular distance from one another in the first direction D1. One or more of the dummy interconnect lines 110d may be electrically connected in parallel to the first lower power lines 120a. As resistance of the first lower power lines 120a is electrically connected in parallel to resistance of the dummy interconnect lines 110d, it may be possible to reduce a voltage drop of a power voltage provided by the first lower power lines 120a.

Figure 12:
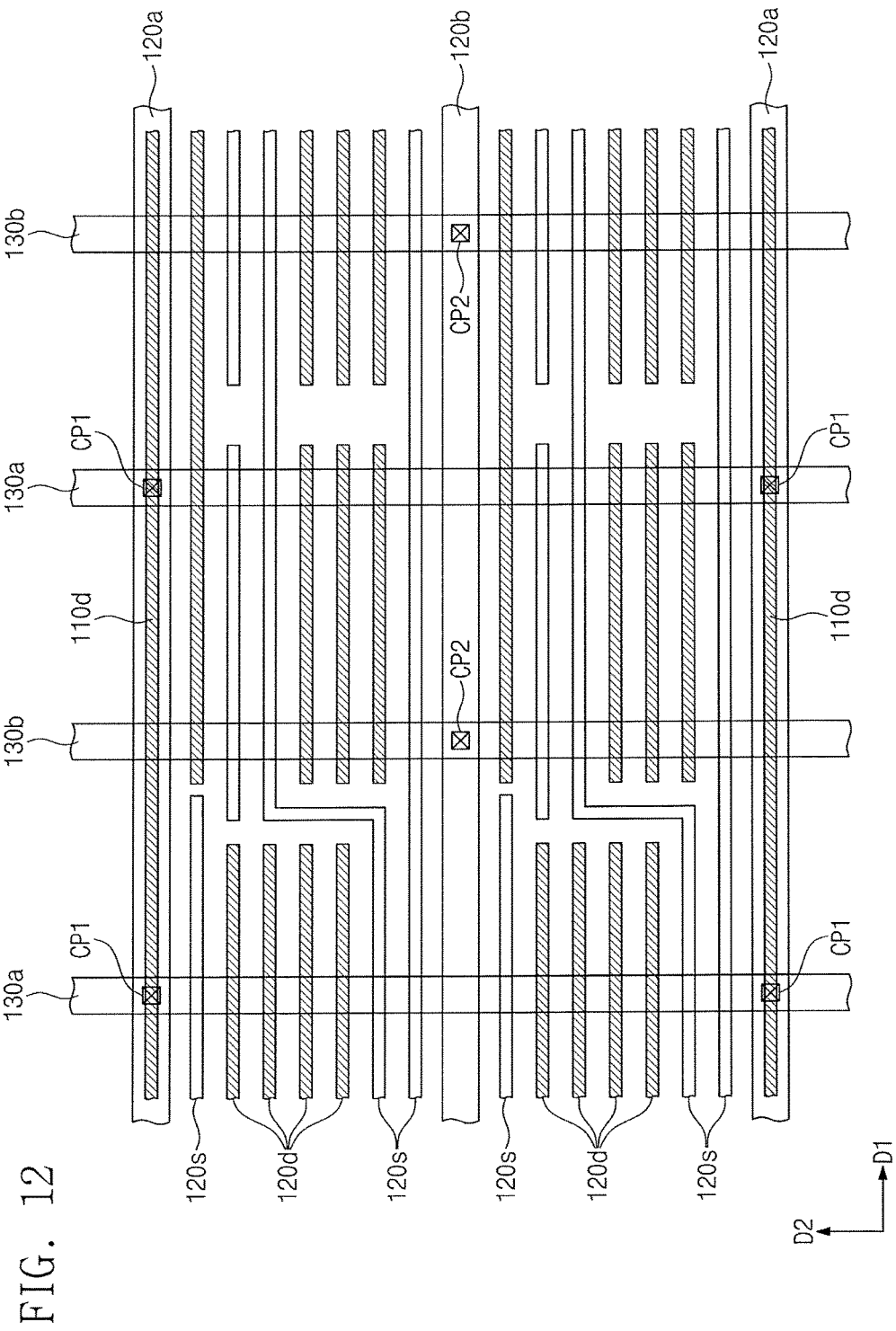
FIG. 12 is a layout of a portion of peripheral circuit region of a three-dimensional semiconductor memory device according to an exemplary embodiment of the present inventive concept.
Figure 13:
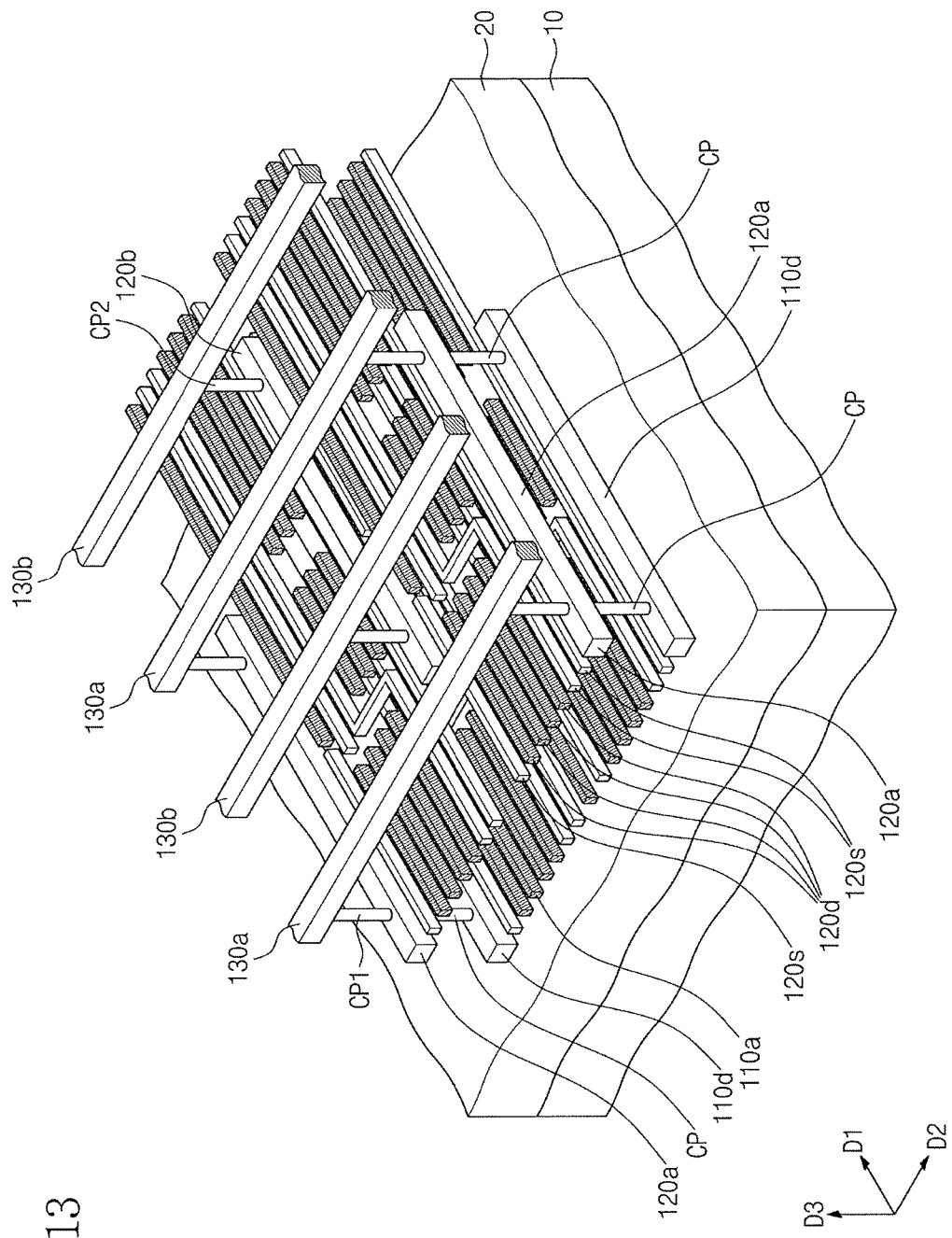
FIGS. 13 and 14 are perspective views illustrating a portion of a peripheral circuit region of a three-dimensional semiconductor memory device according to an exemplary embodiment of the present inventive concept.
Figure 14:
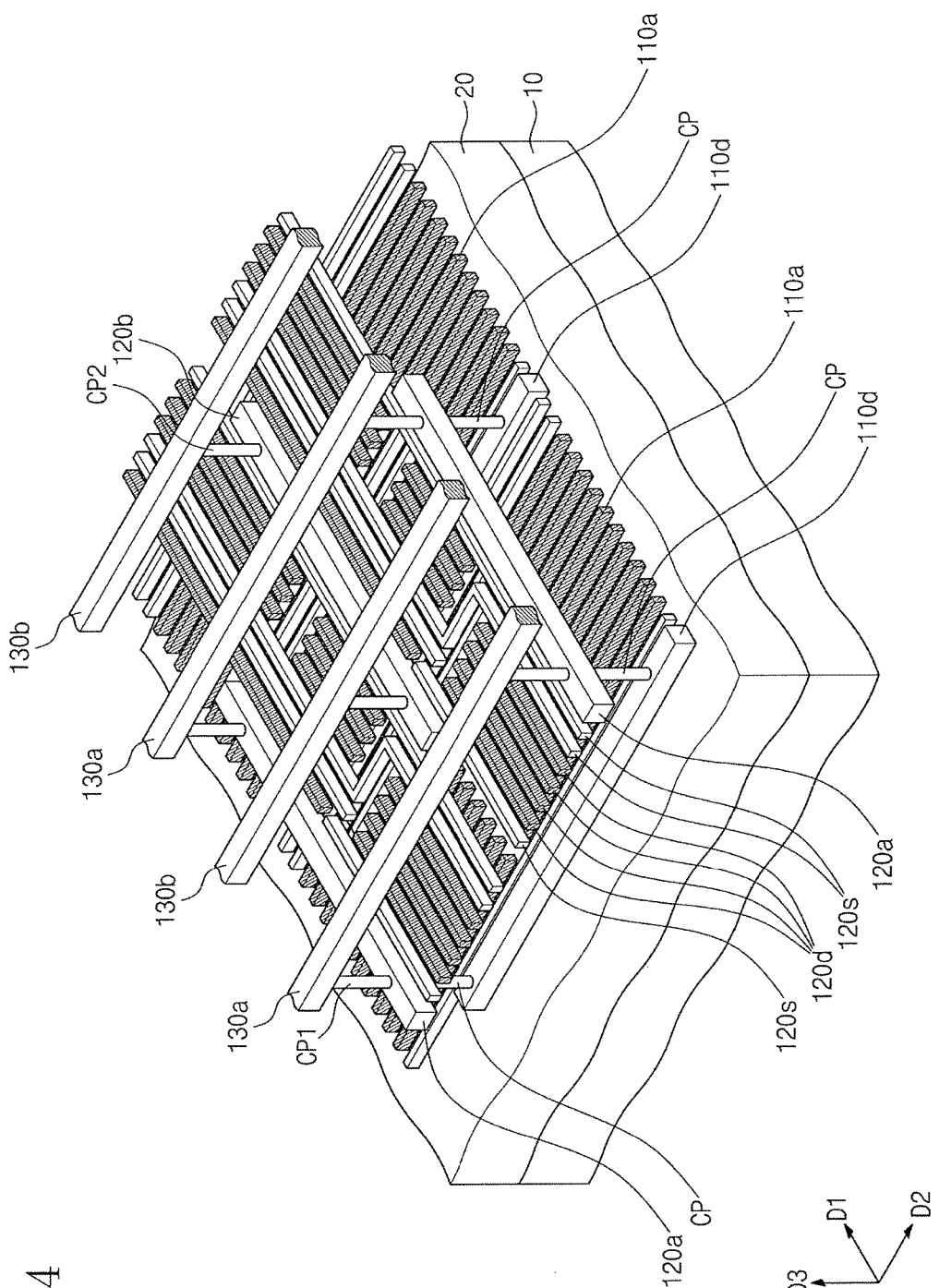

FIG. 12 is a layout of a portion of a peripheral circuit region of a three-dimensional semiconductor memory device according to an exemplary embodiment of the present inventive concept. FIGS. 13 and 14 are perspective views illustrating a portion of a peripheral circuit region of a three-dimensional semiconductor memory device according to an exemplary embodiment of the present inventive concept.

Referring to FIGS. 12 and 13, the standard cells SC explained with reference to FIG. 3 may be disposed on the substrate 10 in the peripheral circuit region R2. As discussed with reference to FIGS. 5A, 5B and 6, each standard cell SC may include logic devices, interconnect lines connected to the logic devices, and power lines.

In an exemplary embodiment of the present inventive concept, the first and second lower power lines 120a and 120b may be disposed to extend along the first direction D1 on the substrate 10 in the peripheral circuit region R2. The first and second lower power lines 120a and 120b may be alternately arranged in the second direction D2. For example, the first lower power lines 120a may be a power voltage line, and the second lower power lines 120b may be a ground voltage line.

The third and fourth upper power lines 130a and 130b may respectively be disposed on the first and second lower power lines 120a and 120b. The third and fourth upper power lines 130a and 130b may extend in the second direction D2 to intersect the first and second lower power lines 120a and 120b. In addition, the first and second upper power lines 130a and 130b may be alternately arranged along the first direction D1. For example, the third upper power lines 130a may be a power voltage line, and the fourth upper power lines 130b may be a ground voltage line.

In an exemplary embodiment of the present inventive concept, as viewed in plan, the first and second lower power lines 120a and 120b may be arranged in a grid shape. In addition, the third and fourth upper power lines 130a and 130b may be arranged in a grid shape. A plurality of first contact plugs CP1 may be disposed at intersections where the first lower power lines 120a cross the third upper power lines 130a, and a plurality of second contact plugs CP2 may be disposed at intersections where the second lower power lines 120b cross the fourth upper power lines 130b. The first contact plugs CP1 may electrically connect the power voltage lines 120a and 130a to one another that are positioned at different heights, and the second contact plugs CP2 may electrically connect the ground voltage lines 120b and 130b to one another that are positioned at different heights.

Routing lines 120s and dummy lines 120d may be disposed between the first and second lower power lines 120a and 120b.

The routing lines 120s and the dummy lines 120d may include conductive material substantially the same to that of the first and second lower power lines 120a and 120b. For example, the routing lines 120s and the dummy lines 120d may include a doped semiconductor, a metal (e.g., tungsten, titanium, tantalum, etc.), a conductive metal silicide (e.g., titanium nitride, tantalum nitride, etc.), and a metal-semiconductor compound (e.g., titanium silicide, tungsten silicide, nickel silicide, etc.).

In an exemplary embodiment of the present inventive concept, the routing lines 120s and the dummy lines 120d may be positioned at the same height from the substrate 10 as the first and second lower power lines 120a and 120b. The routing lines 120s may be a metal line that transmits an electrical signal. The dummy lines 120d may be provided to enhance signal integrity. For example, the dummy lines 120d may be disposed in hollow spaces between the routing lines 120s and between the first and second lower power lines 120a and 120b. The dummy lines 120d may be disposed in hollow spaces between the first and second upper power lines 130a and 130b.

For example, the routing lines 120s and the dummy lines 120d may extend parallel to the first and second lower power lines 120a and 120b along the first direction D1. The dummy lines 120d may have various lengths extending in the first direction D1.

In an exemplary embodiment of the present inventive concept, the dummy interconnect lines 110d may be disposed under the first lower power lines 120a. The dummy interconnect lines 110d may be electrically connected to the first lower power lines 120a through contact plugs CP.

For example, the dummy interconnect lines 110d may extend parallel to the first lower power lines 120a along the first direction D1, and each dummy interconnect line 110d may be electrically connected in parallel to each of the first lower power lines 120a. As resistance of the first lower power lines 120a is electrically connected in parallel to resistance of the dummy interconnect lines 110d, it may be possible to reduce a voltage drop of a power voltage provided by the first lower power lines 120a. Lower dummy lines 110a may be disposed in hollow spaces between the dummy interconnect lines 110d. The lower dummy lines 110a may have a longitudinal axis extending in the first direction D1.

In addition, as shown in FIG. 14, the dummy interconnect lines 110d may extend in the second direction D2 so as to run across and intersect the first lower power lines 120a. Each of the dummy interconnect lines 110d may be electrically connected to the first lower power lines 120a that are spaced apart from one another by a particular distance in the second direction D2. In addition, the dummy interconnect lines 110d may be spaced apart from one another by a particular distance in the first direction D1. The lower dummy lines 110a may be disposed in hollow spaces between the dummy interconnect lines 110d. The lower dummy lines 110a may have a longitudinal axis extending in the second direction D2.

According to an exemplary embodiment of the present inventive concept, the standard cells of the peripheral circuit region can be designed using the interconnect lines having a longitudinal axis in parallel to the bit lines. In other words, the interconnect lines extend in a second direction D2 which is parallel to the bit lines. Accordingly, the standard cells can be provided with a power or ground voltage from the power lines that are separately positioned at different heights, which may increase integration of the power lines disposed on a small area. For example, the peripheral circuit region can be designed to reduce routing congestion in the power lines which provide power to the standard cells.

Furthermore, as the dummy interconnect lines are disposed under the power lines connected to the standard cells and the power lines are electrically connected in parallel to the dummy interconnect lines, a resistance of the power lines can be reduced. Therefore, it is possible to reduce a voltage drop of a power voltage provided to the standard cells.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A semiconductor device comprising:
a substrate including a cell array region and a peripheral circuit region;
a cell array disposed in the cell array region and including a plurality of cell strings connected to a bit line, wherein the bit line extends in a first direction;
a standard cell row disposed in the peripheral circuit region and including a plurality of first cells arranged in a second direction crossing the first direction, the first and second directions being parallel to an upper surface of the substrate, wherein each first cell includes a gate electrode, first and second impurity regions and an active region disposed between the impurity regions;
a plurality of first interconnect lines each having a longitudinal axis in the first direction and connected to the plurality of first cells, wherein a first-first interconnect line of the plurality of first interconnect lines is connected to the gate electrode of a first cell, a second-first interconnect line of the plurality of first interconnect lines is connected to the first impurity region of the first cell and a third-first interconnect line of the plurality of first interconnect lines is connected to the second impurity region of the first cell in the peripheral circuit region; and
a plurality of lower power lines extending in the second direction and connected to the plurality of first cells through the first interconnect lines.

2. The semiconductor device of claim 1, wherein the lower power lines are disposed at a first height from the upper surface of the substrate, and
wherein the semiconductor device further comprises:
a plurality of upper power lines disposed at a second height from the upper surface of the substrate, wherein the second height is greater than the first height, and the upper power lines are extended to be parallel to the lower power lines; and
a plurality of second interconnect lines disposed at a third height from the upper surface of the substrate, wherein the third height is greater than the first height and less than the second height, wherein the second interconnect lines connect the upper power lines to the lower power lines.

3. The semiconductor device of claim 2, wherein a pitch between the upper power lines is greater than a pitch between the lower power lines.

4. The semiconductor device of claim 2, wherein
the lower power lines comprise first lower power lines and second lower power lines alternately arranged in the first direction, and
the upper power lines comprise first upper power lines and second upper power lines alternately arranged in the first direction,
wherein the first lower power lines are connected to the first upper power lines through one of the second interconnect lines, and the second lower power lines are connected to the second upper power lines through another of the second interconnect lines.

5. The semiconductor device of claim 1, wherein the first cells have the substantially same length in the first direction, and the first interconnect lines have a length extending in the first direction less than the length of one of the first cells.

6. The semiconductor device of claim 1, wherein the cell array comprises:
a plurality of word lines extending in the second direction and stacked in a third direction vertical to the upper surface of the substrate:
a plurality of vertical structures extending in the third direction and penetrating the word lines; and
a data storage layer between the word lines and the vertical structures.

7. The semiconductor device of claim 1, wherein the standard cell row comprises a dummy region between the first cells adjacent to one another,
wherein the semiconductor device further comprises dummy lines positioned at substantially a same height as the first interconnect lines in the dummy region of the standard cell row, wherein the dummy lines are electrically connected in parallel to the lower power lines.

8. The semiconductor device of claim 7, wherein the dummy lines extend parallel to the lower power lines along the second direction.

9. The semiconductor device of claim 7, wherein the dummy lines extend along the first direction to intersect the lower power lines.

* * * * *